United States Patent
Dowben et al.

(10) Patent No.: US 8,860,161 B2
(45) Date of Patent: Oct. 14, 2014

(54) NEUTRON DETECTION USING GD-LOADED OXIDE AND NITRIDE HETEROJUNCTION DIODES

(75) Inventors: Peter A. Dowben, Crete, NE (US); Jinke Tang, Laramie, WY (US); David Wisbey, Lafayette, CO (US)

(73) Assignee: Quantum Devices, LLC, Potomac, MD (US)

( * ) Notice: Subject to any disclaimer, the term of this patent is extended or adjusted under 35 U.S.C. 154(b) by 201 days.

(21) Appl. No.: 13/541,923

(22) Filed: Jul. 5, 2012

(65) Prior Publication Data

US 2013/0009262 A1 Jan. 10, 2013

Related U.S. Application Data (60) Provisional application No. 61/505,223, filed on Jul. 7, 2011, provisional application No. 61/505,229, filed on Jul. 7, 2011.

(51) Int. Cl.
| | |
|---|---|
| *H01L 27/14* | (2006.01) |
| *H01L 31/00* | (2006.01) |
| *H01L 31/115* | (2006.01) |
| *H01L 31/109* | (2006.01) |
| *H01L 31/032* | (2006.01) |

(52) U.S. Cl.
CPC .......... *H01L 31/0321* (2013.01); *H01L 31/115* (2013.01); *H01L 31/109* (2013.01)
USPC ................... 257/428; 257/429; 257/E31.028; 250/370.05; 250/390.01

(58) Field of Classification Search
CPC . H01L 31/032; H01L 27/2409; H01L 31/105; H01L 27/14658; H01L 29/2003; H01L 29/872; H01L 21/0254; H01L 29/66143; H01L 31/075; H01L 21/02389; H01L 21/02458; H01L 21/02505; H01L 27/224; H01L 31/109; H01L 31/115; H01L 33/007; H01L 21/31645
USPC ........ 250/370.05, 390.01; 257/183, 428, 429, 257/E45.003, E31.086, E21.359, E29.338, 257/E31.028, E31.061
See application file for complete search history.

(56) References Cited

U.S. PATENT DOCUMENTS

| | | | |
|---|---|---|---|
| 6,771,730 B1 | 8/2004 | Dowben et al. | |
| 7,368,794 B2 | 5/2008 | Caruso et al. | |
| 8,604,441 B2 * | 12/2013 | Mao et al. | 250/390.01 |

OTHER PUBLICATIONS

Jeavons, et al., "A New Position-Sensitive Detector for Thermal and Epithermal Neutrons", Nuclear Instruments and Methods 148 (1978) 29-33.

(Continued)

*Primary Examiner* — Thien F Tran
(74) *Attorney, Agent, or Firm* — Steven B. Kelber; Quantum Devices, LLC (57) ABSTRACT

Solid state neutron detection utilizing gadolinium as a neutron absorber is described. The new class of narrow-gap neutron-absorbing semiconducting materials, including Gd-doped $HfO_2$, Gd-doped EuO, Gd-doped GaN, $Gd_2O_3$ and GdN are included in three types of device structures: (1) a p-n heterostructure diode with a ~30 μm Gd-loaded semiconductor grown on a conventional semiconductor (Si or B-doped Si); (2) a p-n junction or a p-i-n trilayer diode with a Gd-loaded semiconductoron one side and single-crystal semiconducting $Li_2B_4O_7$ layer on the other side of the heterojunction; and (3) a p-n junction or a p-i-n trilayer diode with a Gd-loaded semiconductoron on one side and a boron nitride (BN) semiconductor layer on the other side of the heterojunction.

7 Claims, 5 Drawing Sheets

(56) References Cited

OTHER PUBLICATIONS

Wilk, et al., "High-K Gate Dielectrics: Current Status and Materials Properties Considerations", Jount of Applied Physics vol. 89, No. 10, (2001).

Chennakesavulu, et al, "Nuclear Instruments and Methods in Physics Research Section A: Accelerators, . . . " vol. 571, Issue 3, Feb. 11, 2007, pp. 699-703.

Lukaszew,et al., "Use of Magnetocrystalline Anisotropy in Spin-Dependent Tunneling", Applied Physics Letters, vol. 75, No. 13, (1999).

Tsuda, et al., "Band-Edge Luminescence at Room Temperature of Boron Nitride Synthesized . . . ", Jpn. J. Appl. Phys. vol. 46, No. 13 (2007).

Litvinov, et al., "Reduced Bias Growth of Pure-Phase Cubic Boron Nitride", Appl Phys. Lett. 71 (14) Oct. 6, 1997.

Litvinov, et al., "In situ Texture Monitoring for Growth of Oriented Cubic Boron Nitride Films", Applied Physics Letters vol. 74, No. 7, 1999.

Berner, et al., "Boron Nitride Nanomesh: Functionality from a Corrugated Monolayer", Angew. Chem. Int. Ed 2007, 46, 5115-5119.

McHale, et al, "Schottky Barrier Formation at the Au to Rare Earch Doped GaN Thin Film Interface", Eur. PHys. J. Appl. PHys. 55, 31301 (2011).

McHale, et al., "Resonant PHytoemission of Rare Earth Doped GaN Thin Films", Eur. Phys. J. Appl. Phys. 56, 11301 (2011).

Tsoulfanidis,et al., "Measurement and Detection of Radiation", CRC Press (2011).

Cerullo, et al., "Progress in the Useof Gadolinium for NCT", Applied Radiation and Isotopes 67 (2009) S157-S160.

Schemm, et al, "A Single Chip Computational Sensor System for Neutron Detection Applications", IEEE Sensors Journal, vol. 10, No. 7, Jul. 2010.

Losovyj, et al., "The Electronic Structure Change with Gd doping of HfO2 on Silicon", Applied Physics Letters 91, 132908 (2007).

Ketsman, et al., "The n-type Gd-doped HfO2 to Silicon Heterojunction Diode", Appl. Phys. A 89, 489-492 (2007).

Losovyj, et al., "Optimization of the 3m TGM Beamline, at CAMD, for Constant Initial State Spectroscopy", Nuclear Inst. and Methods in Physics Research, A 582 (2007) 264-266.

Ketsman, et al.,"Gd-Doping of HfO2", Applied Surface Science 254 (2008) 4308-4312.

Schultz, et al., "The K-shell Auger Electron Spectrum of Gadolinium Obtained Using Neutron . . . ", J. Phys. D: Appl. Phys. 43 (2010).

Wilk, et al., "Hafnium and Zirconium Silicates for Advanced Gate Dielectrics", Journal of Applied Physics, vol. 87, No. 1 (Jan. 1, 2000).

Osberg, et al., "A Hand-Held Neutron Detection Sensor System", IEEE 2006.

Aoyama, et al., "A Neutron Detector Using Silicon PIN Photodiodes for Personal Neutron Dosimetry", Nuclear Instruments and Methods in Physics Research A314 (1992) 590-594.

Harms, et al., "Isotopic Conversion in Gadolinium-Exposure Neutron Imaging", Nuclear Instruments and Methods 118 (1974) 583-587.

Ghosh, et al., Science and Technology of Terrorism and Counterterrorism, Second Edition, 2010.

Owens, et al., "Compound Semiconductor Radiation Detectors," Nuclear Instruments and Methods in Physics Research A 531 (2004) 18-37.

Bell, et al., "Neutron Detection with Cryogenics and Semiconductors," Phys. Stat. Sol. (c) 2, No. 5, 1592-1605 (2005).

Caruso, et al., "The All Boron Carbide Diode Neutron Detector: Comparison with Theory", Materials Science and Engineering B 135 (2006) 129-133.

Caruso, et al., "The Heteroisomeric Diode", J. Phys.: Condens. Matter 16 (2004) L139-L146.

Mireshghi, et al., "HIgh Efficiency Neutron Sensitive Amorphous Silicon Pixel Detectors", IEEE Transaction on Nuclear Scient, vol. 41, No. 4, Aug. 1994.

Garber, et al., Neutron Cross Sections vol. II, Curves, Third Edition, vol. II, Jan. 1976.

Shah, et al., "RbGd2Br7: Ce Scintillators for Gamma-Ray and Thermal Neutron Detection", IEEE Transactions on Nuclear Science, vol. 49, No. 4, Aug. 2002.

Reeder, "Thin GSO Scintillator for Neutron Detection", Nucl. Instr. and Meth. in PHys. Res. A 353 (1994) 134-136.

Sakurai, et al., "Experimental Verification of the Nuclear Data of Gadolinium for Neutron Capture Therapy", Journal of Nuclear Science, Supp. 2, pp. 1294-1297 (2002).

\* cited by examiner

NEUTRON DETECTION USING GD-LOADED OXIDE AND NITRIDE HETEROJUNCTION DIODES

PRIORITY DATA AND INCORPORATION BY REFERENCE

This application claims benefit of priority to U.S. Provisional Patent Application Nos. 61/505,223 and 61/505,229, both filed Jul. 7, 2011. The disclosures of both these applications are incorporated herein by reference in their entirety. This invention was made with government support under HDTRA1-07-1-0008 awarded by the Defense Threat Reduction Agency. The Government has certain rights in the invention.

BACKGROUND OF THE INVENTION

1. Field of the Invention

This invention generally relates to solid state neutron detectors and, more specifically, to neutron detectors made with Gd-containing oxide and nitride heterojunctions, and corresponding fabrication processes.

2. Related Art

There are several approaches to detecting and monitoring neutrons, including use of neutron scintillation detectors, $^3$He detectors, solid-state conversion layer detectors, and neutron-absorbing semiconductor solid-state detectors. In every case, neutrons are captured. Generally, the commercially available neutron detectors based on $^3$He [1] and CdZnTe [2], [3] are not sensitive enough, are too bulky, have considerable power requirements and are too expensive to be widely applicable for fissile material interdiction operations. This is partly because the operational devices tend to require higher voltages even for the detection of thermal neutrons. In addition, efficiency is largely dependent upon the efficient capture of the neutron, which is 3840 and 2454 barns for thermal neutrons in $^3$He and Cd respectively. The resulting unstable atom decays by emitting more easily detected radiation, such as an alpha particle. Moreover, these devices are bulky and require more power for operation and signal generation, while at the same time have more limited lifetimes. Furthermore, it is clear that supplies of $^3$He are in increasingly short supply so less expensive alternatives must be sought.

A problem with this thermal neutron detection method is that neutrons emitted by fissile materials are fast, with an average energy of 1.5 MeV, while the capture cross section is greatest for slow (epithermal to thermal) neutrons. For this reason, neutron detectors based on $^3$He or Cd need a thick moderating layer (at least several centimeters) in order to thermalize the neutrons to ~30 meV or less which reduces the efficiency owing to inelastic scattering losses in the moderator. Moreover, these devices are bulky and require more power for operation and signal generation, while at the same time have more limited lifetimes. Furthermore, it is clear that supplies of $^3$He are increasingly short supply so in expensive alternatives must be sought.

Solid-state neutron detectors may potentially increase efficiency without adding to the overall volume (bulk) of the detection system, provided an appropriate capture material can be used. Semiconductor detectors can be relatively inexpensive, robust and reliable, and exhibit a compact volume, and require less power. Thus, a neutron detector based upon a semiconducting medium could be made portable and powered by batteries with an extended operational lifetime.

An important milestone was recently achieved with the development and demonstration of a $^{10}$B-based boron-carbide semiconductor neutron detector [4], [5]. By using B as a capture material within the semiconductor, the device lifetime was greatly increased, and the power consumption greatly reduced. However, owing to $^{10}$B neutron capture cross-sections, the system still requires a thick moderating layer to achieve practicable performance. Thus an ideal efficiency and compactness was not realized.

The extremely large thermal neutron absorption cross section of gadolinium (Gd) is an attractive property for creating a high efficiency neutron detector. Natural Gd has a thermal neutron capture cross section of 46,000 barns, while 15.65% abundant $^{157}$Gd has a cross section of 255,000 barns [6-10]. Additionally, the Gd cross section remains significant out to neutron energies of about 200 meV [8-10].

This cutoff energy is higher than, for example, boron whose cross section drops greatly above 25-30 meV [8-10] and hence allows the use of less moderating material if detection of high energy neutrons is desired [1,1]. With the significant natural abundance of large cross section isotopes of Gd, isotopic enrichment is not necessary even for a thin film device of fairly modest thickness. Indeed for a 15% Gd doped HfO$_2$ layer, the neutron absorption for 100 meV neutrons is comparable to a boron carbide layer for 30 meV neutrons; requiring a layer in the region of 30-40 microns for the same opacity. Enriched $^{157}$Gd is commercially available and may be used to quintuple the absorption, if needed. The $^{157}$Gd(n,γ)$^{158}$Gd and $^{155}$Gd(n,γ)$^{156}$Gd reactions involve the emission of energetic gamma particles which do not significantly contribute to local energy transfer, as well as low-energy X-rays, conversion electrons, and Auger electrons. The conversion electrons are emitted at about 220 keV for $^{155}$Gd and through a number of decay channels for $^{157}$Gd, of which the 79.5 keV and 182 keV ones are dominant[12-15]; in addition, Auger electrons are emitted at 40 keV (K-shell transitions accompanied by a 44 keV X-ray photon) and 5-8 keV (L-shell transitions). The M-shell binding energy is only 1.8 keV, producing a peak close to the direct 79.5 keV channel.

Thermal neutron reactions with Gd differ significantly from $^{10}$B or $^6$Li interactions because it nearly always results in an (n,γ) reaction, as in:

$$^{157}\text{Gd}(n,\gamma) \rightarrow {}^{158}\text{Gd}+\gamma+\text{X-rays}+\text{IC } e^- +\text{ACK } e^-, \qquad (1)$$

which leads to the emission of low-energy gamma rays and conversion electrons. $^{10}$B or $^6$Li interactions undergo (n,α) reactions with a large Q-value, such as the $^{10}$B(n,α)$^7$Li neutron capture reactions:

$$^{10}\text{B}+n \rightarrow {}^7\text{Li}(0.84 \text{ MeV})+{}^4\text{He}(1.47 \text{ MeV})+\gamma(0.48 \text{ MeV}) \, 94\% \qquad (2)$$

$$^{10}\text{B}+n \rightarrow {}^7\text{Li}(1.02 \text{ MeV})+{}^4\text{He}(1.78 \text{ MeV}) \, 6\% \qquad (3)$$

and $^6$Li(n,α)T neutron capture reaction:

$$^6\text{Li}+n \rightarrow {}^3\text{H}^+ +{}^4\text{He}^{2+}+4.5 \text{ MeV}. \qquad (4)$$

The relatively low energy of the conversion electrons produced by the $^{157}$Gd (20-40 times smaller than the $^{10}$B(n,α)$^7$Li reaction) is the main drawback of using Gd as a neutron detector. This does not necessarily reduce detection efficiency, as long as the current pulses from 79.5 keV and other conversion electrons can be reliably identified. But the devices will require large depletion or charge collection regions of 50-60 microns in the total neutron if the generated signal is to be obtained. We show below that all these electrons can be detected, because Gd-based devices can have much smaller leakage currents (and hence noise) compared to boron-carbide devices. Furthermore the host semiconductors can be fabricated so that while only a few microns is required for neutron opacity, the semiconductor device can retain a fairly large (50 micron) charge collection region. Indeed the host semiconductors are well known to be compatible with having the necessary 1-10 fF charge to voltage amplifier constructed right on the detector heterostructure itself, thus leading to other improvements in noise rejection.

Neutron and other similar heavy particle detectors present an increasingly important component of national safety and security. Ideally, handheld solid-state detectors will allow inspectors to track the shipment of radioactive materials intrastate and inter-state. There is ideally a method by which every ship entering every harbor in the United States, and every vehicle crossing every national boundary, as well as truck weigh stations distributed throughout the National highway system, can be monitored, so that the safety of known shipments of radioactive materials can be documented, and the introduction of unwanted materials can be kept from elements adverse to the interests of a nation. A solid state detector, which permitted both qualitative (i.e., there is radioactive material present) and quantitative (how much material is present) outputs would advance these interests significantly. Representative neutron detectors are disclosed in U.S. Pat. Nos. 6,771,730 and 7,368,794, both of which are incorporated herein-by-reference.

Incorporating Gd into a semiconductor diode detector has many of the potential advantages associated with diode detectors such as an increased number of carriers, compact size, relatively fast timing response and a controllable depletion depth [16]. Hafnium oxide ($HfO_2$) is an obvious choice to incorporate Gd into a diode detector because Gd is readily incorporated into the $HfO_2$ lattice [17-21], with the Gd occupying the Hf sites. The high resistivity and high thermodynamic stability of $HfO_2$ in contact with Si also indicates [22] that a Gd doped $HfO_2$/Si heterojunction has the potential to make a useful device [19-20]. Other possibilities including Gd doped GaN or Gd containing oxide heterojunctions with lithium borates or with B doped Si as well as heterojunctions of Gd containing nitrides to boron nitride will be discussed later. It should be mentioned here that these semiconductor heterojunction diode detectors are fundamentally different from the conversion layer devices based on Gd foils and films [23].

In addition to neutron detection for homeland security purposes, the advantages of the solid state neutron detector, including vibration resistance, high temperature operation and low power consumption, make them desirable for oil well logging. In such a process, a neutron source and a detector are lowered into the well as it is being drilled. The detector measures the amount of neutrons that scatters back from the well's surroundings, which indicates the porosity of the rocks and abundance and quality of the hydrocarbon zones in the geological formations below the Earth's crust.

SUMMARY OF THE INVENTION

We have developed novel semiconducting materials and diode-like device architectures utilizing $^{157}$Gd, $^{10}$B, $^{6}$Li isotopes as the neutron absorbers. The appeal of $^{157}$Gd stems from its very high neutron capture cross-section, which remains usable at significantly higher neutron energies (up to 200-300 MeV) compared to $^{10}$B or other common absorbers. Gd containing semiconducting materials, especially when combined with B and Li detectors, require only a 2 to 4 cm moderator layer to thermalize neutrons; have superior sensitivity and broadened neutron spectral range; offer robust, inexpensive and compact solutions suitable for an unsophisticated user; and, because of the need for only a small Gd-doped layer thickness of ~30 μm (made possible by the large Gd cross-section), discriminate neutrons from gamma radiation from fissile materials. These detectors will potentially be cheaper, lighter, faster, and more sensitive than anything currently available and ideally suited for homeland security needs.

The new class of wide-gap neutron-absorbing semiconducting materials, including Gd-doped $HfO_2$, Gd-doped $Li_2B_4O_7$ and $Gd_2O_3$ as well as Gd-doped GaN will be included in three types of device structures: (1) a p-n heterostructure diode with a ~30 μm Gd-loaded semiconductor grown on a conventional semiconductor (Si or B-doped Si); (2) a p-n junction or a p-i-n trilayer diode with a Gd-loaded semiconductor on one side and single-crystal semiconducting $Li_2B_4O_7$ layer on the other side of the heterojunction; and (3) a p-n junction or a p-i-n trilayer diode with a Gd-loaded semiconductor on one side and a boron nitride (BN) semiconductor layer on the other side of the heterojunction. The p-i-n trilayer structure referred to in part (2) and (3) can be more efficient compared to a p-n diode if the insulating region also contains Gd, since the vastly greater depletion region should improve signal detection. Boron nitride (BN) is used as the companion to Gd containing nitrides for a more desirable nitride-to-nitride interface at the heterojunctions. To maximize gamma ray "blindness" a p-i-n structure (p-type semiconductor—insulator-n-type semiconductor) is preferred. Representative insulators include $SiO_2$ and $Al_2O_3$.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION

Gadolinium-doped films of GaN, and related thin films are prepared as reported in *Eur. Physical J. Applied Physics* 55, 3.

31303 (2011) and *Eur. Physical J. Applied Physics* 56, 1, 11301 (2011) incorporated herein-by-reference—for their disclosure of methods of preparing thin films of Gd-doped rare earth materials. The films of this invention can be prepared as is done for the Gd-doped GaN films. The Gd doped thin films (50-300 nm, but ideally 4-60 microns) are fabricated on an active substrate such as Si(111) or an insulating substrate such as $SiO_2$ or sapphire $Al_2O_3$ substrates by RF plasma (EPI 620) assisted molecular beam epitaxy (MBE). The growth parameters for the deposition of Gd-doped (in situ) GaN thin films are a base pressure of 10-11 Torr, nitrogen flux of 0.75-1.0, RF power of 500 W, substrate temperature of 850-900° C., Ga cell temperature of 850° C., and Gd cell temperatures of 1050-1100° C.

The thickness of the films is measured with a surface profilometer and atomic force microscopy. The orientation, crystal structure, and phase purity of the films are established by Cu $K_\alpha$ ($\lambda$=1.5406 A) radiation X-ray diffraction using a Siemens D5000 X-ray diffractometer. The X-ray diffraction (XRD) patterns of Gd-doped GaN films show c-axis orientation and a high degree of crystallinity. The presence of any secondary phases or spurious peaks was not observed. Slight shifts in diffraction peak positions towards lower Bragg angles has been observed with Gd-doped GaN thin films (50-300 nm) fabricated on Si(111), which is indicative of some lattice expansion, as is expected. The elemental compositions of the Gd-doped GaN thin films grown under different conditions were characterized by energy dispersive spectroscopy (EDS) and a VG Microtech XPS attached to the MBE growth system (VG Microtech). The measured concentrations were found to be at 1-2%, as confirmed from the Ga $2p_{3/2}$, Gd 4d, and N is core level XPS intensities using an Al $K\alpha$ (1486.8 eV) X-ray source. Doping levels effectively range from three percent to 30 percent (3%-30%).

The novel solid-state neutron detectors based on these Gd-doped semiconductors have been prepared and tested as to their properties. In particular, Gd-doped $HfO_2$ heterojunction devices [17-21] as well as narrow(er) band gap Gd-doped and Gd containing semiconductors and insulators have been fabricated and tested to establish a new class of solid-state neutron detectors.

Our measurements indicate that 3% Gd-doped $HfO_2$ has n-type character due to overcompensation by oxygen vacancies [17,18], but at higher Gd doping levels the character switches to a p-type semiconductor[17,20]. NEXAFS and EXAFS data indicate that Gd substitutes at Hf sites in the $HfO_2$ films, as expected [21]. The resulting Gd-doped $HfO_2$ on silicon heterojunctions are demonstrated in the I-V curves shown in FIG. 1.

Figure 1:
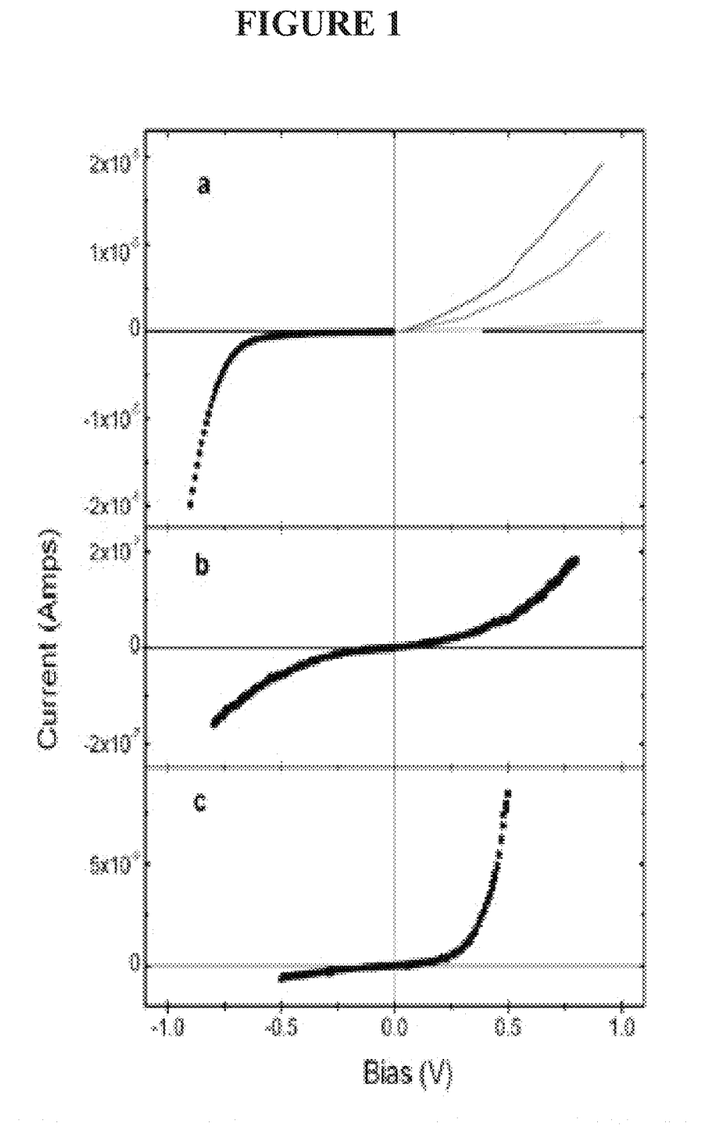
FIG. 1 reflects values for a heterojunction diode constructed from Gd doped $HfO_2$ on silicon, for various Gd doping concentrations. With oxygen vacancies, the Gd doping, in 3% Gd-doped $HfO_2$, is over compensated and forms a rectifying diode on p-type silicon (a). The 10% Gd-doped $HfO_2$ is not overcompensated by oxygen vacancies and does not form a rectifying diode on p-type silicon (b) but does do so on n-type silicon (c). The increase in reverse bias current for a 3% Gd-doped $HfO_2$ rectifying diode on p-type silicon, illuminated with visible light (red) and with an incident neutron and gamma flux from a PuBe source (blue) is indicated.

Several p-n heterojunction diodes were fabricated with strongly textured monoclinic and fluorite Gd-doped $HfO_2$ on Si(100) [17,18,21]. At 3% doping, excellent diode rectification is seen for the heterostructure with p-type Si (FIG. 1*a*). Byway of comparison, 10% Gd-doped $HfO_2$ behaves as a p-type semiconductor; the contact with p-type Si is Ohmic (FIG. 1*b*), and that with n-type Si is rectifying (FIG. 1*c*).

Neutron capture is already detectable in heterojunctions formed by combining 3% Gd-doped$HfO_2$ and p-type Si. As seen in FIG. 1*a*, the reverse bias current increases under bright white-light illumination and even more so under irradiation by epithermal neutrons (600 n/cm$^2$·s) and gamma particles emitted by a fully moderated PuBe source [21,24,25](although from further testing described below, we do not believe that the gamma radiation has any appreciable effect on the increased current). Taken alone, this does not prove that neutrons or gamma particles are detected by means of their capture by nuclei, because the effect might also be due to photoconductivity. However, further experiments provide compelling evidence of neutron detection [21]. First, measurements revealed that the diode currents scaled with the reactor power. Second, the pulse height spectra recorded for the heterojunction diodes with 15% Gd-doped $HfO_2$ layers using the PuBe source were found to agree well with Monte Carlo simulations using the MCNP (Monte Carlo N-Particle Transport Code) package (see FIG. 2). For these measurements, the output signal from the detector diode is passed through a standard capacitor-resistor filter and then fed to the charge-coupled amplifier; pulses are detected by voltage-spike triggering with subsequent charge integration over a preset time period. Typical $^{157}$Gd internal conversion events in Gd-doped $HfO_2$ generate voltage spikes of 0.1-1 V against the background noise on the order of a few millivolts. After electronic suppression of the low-energy events, pulses in the 30-100 keV range are readily detected with the individual Gd K-shell Auger resonances resolved, which shows the promise of our proposed devices.

Figure 2:
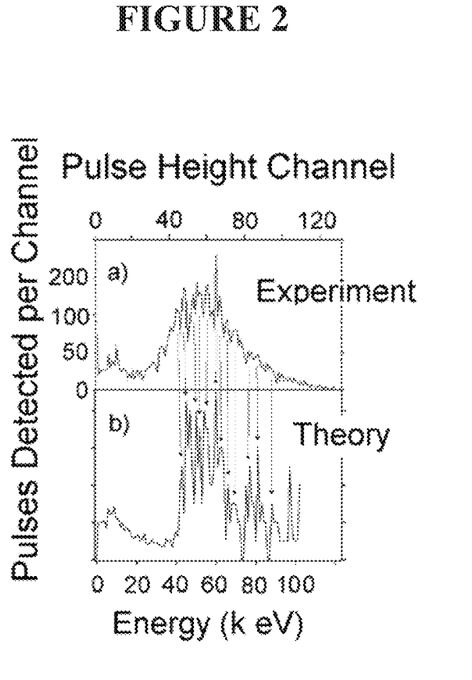
FIG. 2 is (a) Pulse height spectra for 15% Gd-doped $HfO_2$/n-Si(100) diodes under a $2.2\times10^4$ n/cm$^2$·s thermal/epithermal neutron flux from a PuBe source; (b) Monte Carlo (MCNP) simulations corrected for 40 mV discriminator cutoff but not for incomplete charge collection.

The spectrum is in excellent agreement with the MCNP simulation which was performed for the 30 eV-14 MeV range. The simulated non-uniform pulse height spectrum agrees with the measured one, proving that the pulses come from neutron capture events (FIG. 2). The deviations between theory and experiment are expected (and observed) at larger energies due to incomplete charge collection in the thin Gd-doped $HfO_2$ film [21]. For the device proposed as part of our research plan the film thickness (about 30 nm) remains much smaller than the mean-free path of the high-energy gamma particles, although the devices will be largely neutron opaque. This means that we can therefore continue to ignore the gamma contributions. Generally the same cannot be said for $Gd_2O_3$ based devices, which are seen to be gamma sensitive.

Figure 3:
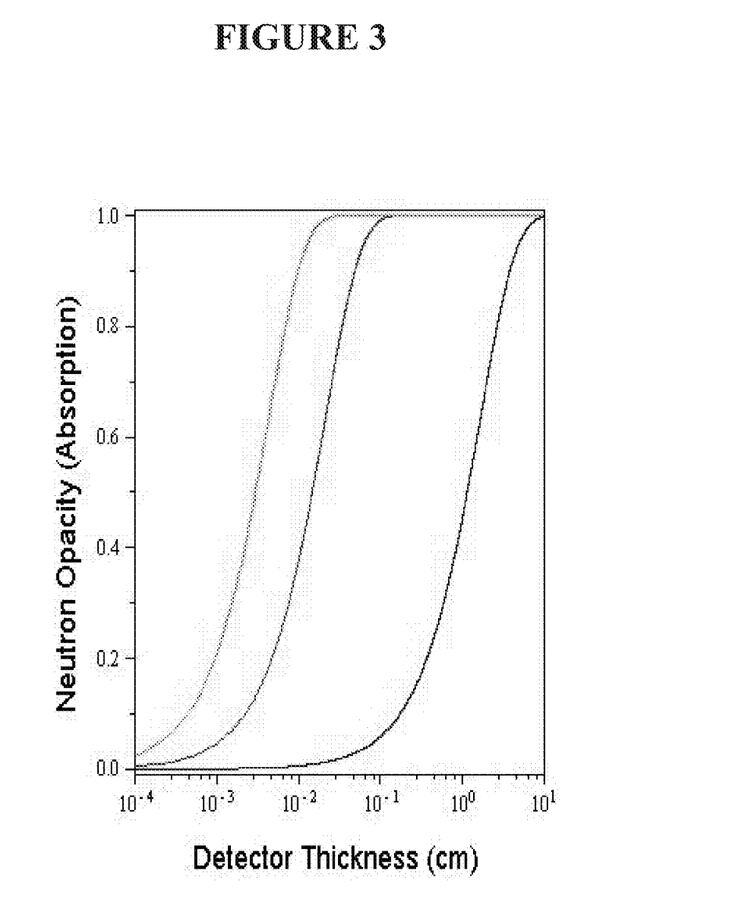
FIG. 3 gives calculated attenuation of 30 meV (green line) and 100 meV (red line) neutron and 1 MeV gamma (blue line) radiation in 15% unenriched Gd-doped $HfO_2$ (or similar oxide) as a function of film thickness.

Other tests have been conducted that also exclude gamma detection events. Note that the problems of gamma interference and low efficiency which are known for Gd conversion foils [28-30] were related to their large thickness, which is comparable to the gamma mean-free path, and metallicity, which, together with film thickness, severely limits the ability to collect the charge pulses. Importantly, for our preliminary devices no pulses were observed when the neutron flux was blocked using a Cd foil. This shows that the device is essentially blind to gamma-radiation from the PuBe source, and almost all detected pulses (FIG. 2) are due to neutron capture, although the photoelectron currents (yields) from the X-ray emission induced by neutron capture can explain some of the pulse counting features. Based on this observation, we expect that the proposed Gd-based neutron detectors will reliably discriminate neutrons from the gamma radiation from fissile materials. This is also clear from theoretical estimates. In spite of the large nuclear charge and hence relatively large gamma absorption cross-section, the neutron capture cross-section is so large that there is a wide workable range of thicknesses (tens of microns) where the Gd-doped film is opaque to neutrons and almost transparent to typical gamma photons (see FIG. 3). If required, this discrimination can be further improved by a factor of 5 by using isotopically enriched $^{157}$Gd (for approximately $50 per device).

Although the pulse charge is 20-40 times smaller for Gd semiconductor solid state devices, compared to $^{10}$B based solid state devices, the signal-to-noise ratio is in fact better due to greatly reduced circuit noise. $HfO_2$ are much smaller compared to boron-carbide devices. This is not surprising because $HfO_2$ is a high-k material, which in particular is actively pursued as a thin gate dielectric in semiconductor technology [31].

Figure 4:
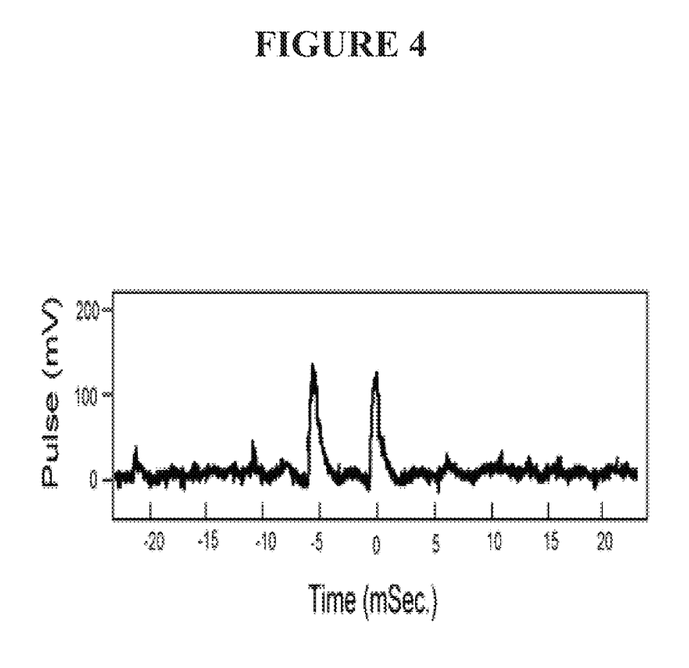
FIG. 4 illustrates pulses observed in 15% Gd-doped HfO2/n-Si diodes under thermalized neutron flux of 600 n/s from a PuBe source (raw signal).

The Gd neutron capture internal conversion events can also be identified in the unfiltered signal (see FIG. 4), although the signal-to-noise ratio is only of the order of 10. Although these devices can already be used as neutron detectors, better signal processing should improve the recording of current pulses which are incompletely collected due to charge track and device geometry issues; the latter issue is common for thin-film heterojunction-based particle sensors, and a number of established strategies will increase signal detection efficiencies by as much as a factor of 250 over our preliminary devices. The use of host semiconductors with a smaller band gap of about 1 eV (similar to silicon), which is still large enough to avoid any detrimental leakage currents, is the most promising path for achieving the maximum possible signal-to-noise ratio and the most efficient and reliable automatic detection and pulse analysis. The emphasis on smaller band gap is important because the integrated pulse current in a solid-state detector is a function of the band gap. Too large a band gap reduces the effective gain in the solid-state detector; of course, we also wish to avoid too small a band gap as the device should still work at elevated temperature without a significant leakage current.

Figure 5:
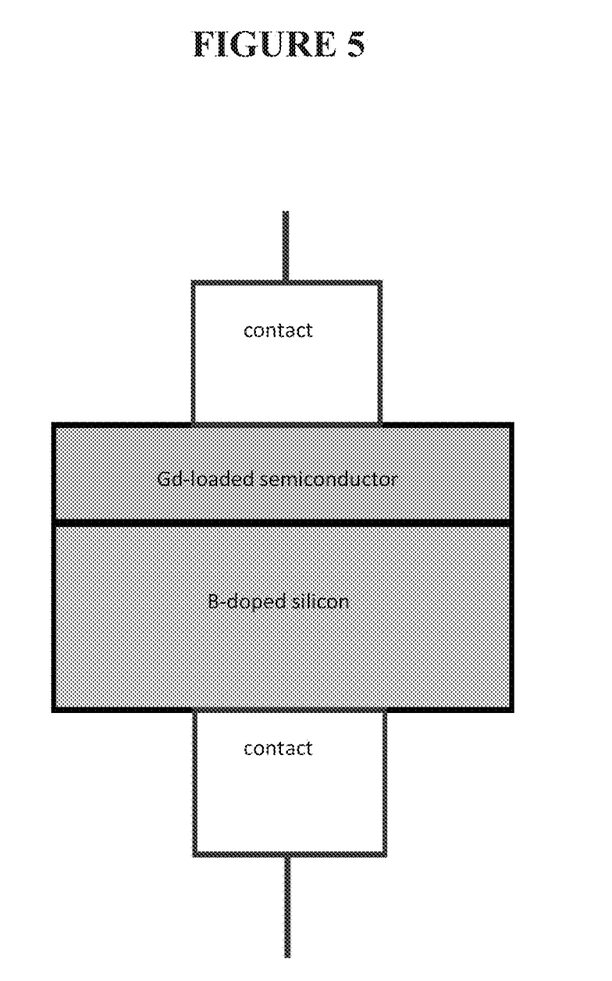
FIG. 5 is a schematic of a type (1) p-n heterostructure diode with a ~30 μm Gd-loaded semiconductor grown on a conventional semiconductor, B-doped Si. Type (2) or type (3) diode is realized by replacing Si with $Li_2B_4O_7$ or BN.

The new class of wide-gap neutron-absorbing semiconducting materials, including Gd-doped $HfO_2$, Gd-doped $Li_2B_4O_7$ and $Gd_2O_3$ as well as Gd-doped GaN, will be included in three types of device structures: (1) a p-n heterostructure diode with a ~30 μm Gd-loaded semiconductor grown on a conventional semiconductor (Si or B-doped Si) (FIG. 5 shows such a diode); (2) a p-n junction or a p-i-n trilayer diode with a Gd-loaded semiconductor on one side and single-crystal semiconducting $Li_2B_4O_7$ layer on the other side of the heterojunction; and (3) a p-n junction or a p-i-n trilayer diode with a Gd-loaded semiconductor on one side and a boron nitride (BN) semiconductor layer on the other side of the heterojunction. The p-i-n trilayer structure referred to in type (2) and (3) can be more efficient compared to a p-n diode if the insulating region also contains Gd, since the vastly greater depletion region should improve signal detection (due to more efficient charge collection in the low flux limit).

The choice of $Li_2B_4O_7$ as the companion boron-rich semiconductor is driven by the need to make it compatible with rare-earth oxide chemistry, and the fact that oxide-to-oxide interfaces are much more likely to be chemically stable. Another advantage of $Li_2B_4O_7$ is that it is suitable for solid-state neutron detection, as has been recently demonstrated [32,33], and recent preliminary efforts indicate we can dope this material both n-type and p-type while retaining good semiconductor properties. Boron nitride (BN) is used as the companion to Gd containing nitrides. Although BN was found to make poor neutron detector materials, new chemical vapor deposition techniques using borazine $(B_3N_3)H_6$ have been very effective in growing a quality semiconductor [34-38]. We have also developed an atomic layer epitaxy growth method that has proved to be very effective on a wide variety of substrates bases on the reaction of anhydrous $BCl_3$ and $NH_3$. In both cases, nitride-to-nitride interfaces are much more chemically stable than an oxide to nitride interface.

REFERENCES

[1] W. H. Miller, "Nuclear Terrorism: Radiation Detection", in *Science and Technology of Terrorism and Counterterrorism*, edited by T. K. Ghosh, M. A. Prelas, D. S. Viswanath, and L. K. Lyalka, Marcel Dekker, New York, ISBN 0-8247-0870-9 (2002) pp. 265.

[2] A. Owens and A. Peacock, *Nucl. Instrum. Methods* A 531 (2004) 18-27.

[3] Z. W. Bell, D. A. Carpenter, S. S. Cristy, V. E. Lamberti, A. Burger, B. F. Woodfield, T. Niedermayr, I. Dragos Hau, S. E. Labov, S. Friedrich, W. G. West, K. R. Pohl and L. van der Berg, *Phys. Stat. Solidi* C 2 (2005) 1592-1605, and the references therein.

[4] A. N. Caruso, P. A. Dowben, S. Balkir, N. Schemm, K. Osberg, R. W. Fairchild, O. Barrios Flores, S. Balaz, A. D. Harken, B. W. Robertson, J. I. Brand, *Mat. Sci. Eng.* B 135 (2006) 129-133.

[5] A. N. Caruso, R. B. Billa, S. Balaz, J. I. Brand, P. A. Dowben, *J. Phys. Cond. Matt.* 16 (2004) L139-L146.

[6] A. Mireshghi, G. Cho, J. S. Drewery, W. S. Hong, T. Jing, H. Lee, S. N. Kaplan, V. Perez-Mendez: *IEEE Transactions on Nuclear Science* 41, (1994) 915.

[7] D. I. Garber and R. R. Kinsey: BNL 325: *Neutron Cross Sections*, $3^{rd}$ ed., Vol. 2, Upton: Brookhaven National Laboratory, 1976.

[8] V. McLane, C. L. Dunford and P. F. Rose, *Neutron Cross Sections*, vol. 2, San Diego: Academic Press, 1988.

[9] *Nuclides and Isotopes: Chart of the Nuclides*, $16^{th}$ ed, ed. E. M. Baum, H. D. Knox and T. R. Miller, (Knolls Atomic Power Laboratory, 2002), 58.

[10] http://atom.kaeri.re.kr/cgi-bin/endfform.pl, Korea Atomic Energy Research Institute.

[11] "Experimental Nuclear Reaction Data (EXFOR/CSISRS)," National Nuclear Data Center, Brookhaven National Laboratory; available off the internet (nndc.bnl.gov/exfor/exfor00.); accessed on 28 Mar. 2008.

[12] K. S. Shah, L. Cirignano, R. Grazioso, M. Klugerman, P. R. Bennet, T. K. Gupta, W.W. Moses, M. J. Weber, S. E. Derenzo; 2001.

[13] S. F. Mughabghab, Neutron Cross Sections, Vol. 1, Academic Press 1981.

[14] P. L. Reeder, "Thin GSO scintillator for neutron detection", *Nucl. Instr. Meth. Phys. Res.* A 353 (1994) 134-136.

[15] Y. Sakurai and T. Kobayashi, "Experimental verification of the nuclear data of gadolinium for neutron capture therapy," *J. Nucl. Sci. Tech. Suppl.* 2 (2002) 1294.

[16] G. F. Knoll, *Radiation Detection and Measurement*, $3^{rd}$ Ed., (John Wiley & Sons, Hoboken, 2000).

[17] Ya. B. Losovyj, I. Ketsman, A. Sokolov, K. D. Belashchenko, P. A. Dowben, J. Tang, Z. Wang,"The Electronic Structure Change with Gd doping of HfO2 on Silicon", *Appl. Phys. Lett.* 91 (2007)132908-3.

[18] Thor Ketsman, Ya. B. Losovyj, A. Sokolov, Jinke Tang, Zhenjun Wang, K. D. Belashchenko and P. A. Dowben, "The n-type Gd-doped HfO2 to silicon heterojunction diode", *Applied Physics A: Mater. Sci. Process.* 89 (2007) 489-492.

[19] Yaroslav Losovyj, Ihor Ketsman, Eizi Morikawa, Zhenjun Wang, Jinke Tang, and Peter Dowben, "Optimization of the 3m TGM beamline, at CAMD, for constant initial state spectroscopy", *Nucl. Instrumen. Methods Phys. Res.* A 582 (2007) 264-266.

[20] Thor Ketsman, Ya. B. Losovyj, A. Sokolov, Jinke Tang, Zhenjun Wang, M. Natta, J. I. Brand and P. A. Dowben, "Gd-doping of HfO2", *Appl. Surf. Sci.* 254 (2008) 4308-4312.

[21] David Schultz, Bryan Blasy, Juan Colon Santana, J. C. Petrosky, J. W. McClory, D. LaGraffe, J. I. Brand, Jinke Tang, Wendong Wang, N. Schemm, S. Balkir, M. Bauer, I. Ketsman, R. W. Fairchild,Ya. B. Losovyj, and P. A. Dowben, "The K-shell Auger Electron Spectrum of Gadolinium Obtained Using Neutron Capture in a Solid State Device", *J. Phys. D: Applied Physics* 43 (2010) 075502.

[22] G. D. Wilk, R. M. Wallace and J. M. Anthony, J. Appl. Phys. 87, (2000) 484.

[23] R. L. Schulte and F. R. Swanson, U.S. Pat. No. 5,659,177 (1997).

[24] A. N. Caruso, P. A. Dowben, S. Balkir, N. Schemm, K. Osberg, R. W. Fairchild, O. B. Flores, S. Balaz, A. D. Harken, B. W. Robertson, and J. I. Brand, "The All Boron Carbide Diode NeutronDetector: Comparison with Theory", *Materials Science and Engineering* B 135 (2006) 129-133.

[25] K. Osberg, N. Schemm, S. Balkir, J. I. Brand, S. Hallbeck, P. Dowben and M. W. Hoffman, "AHand-Held Neutron Dectector Sensor System Utilizing a New Class of Boron Carbide Diode", *IEEE Sensors Journal* 6 (2006) 1531-1538.

[26] S.F. Mughabghab, *Neutron Cross Sections*, Vol. 1, Academic Press 1981.

[27] P. L. Reeder, "Thin GSO scintillator for neutron detection", *Nucl. Instr. Meth. Phys. Res.* A 353 (1994) 134-136.

[28] T. Aoyama, Y. Oka, K. Honda, and C. Mori, "A neutron detector using silicon PIN photodiodes forpersonal neutron dosimetry," *Nucl. Instr. Meth. Phys. Res.* A314 (1992) 590-594.

[29] A. A. Harms, and G. McCormack, "Isotopic Conversion in Gadolinium-Exposure NeutronImaging," *Nucl. Instr. and Meth.* 118 (1974) 583.

[30] A. P. Jeavons, N. L. Ford, B. Lindberg, and R. Sachot, "New Position-Sensitive Detector ForThermal And Epithermal Neutrons," *Nucl. Instr. and Meth.* 148 (1978) 29.

[31] G. D. Wilk, R. M. Wallace, and J. M. Anthony, "High-k dielectrics: Current status and materialsproperties and considerations," *J. Appl. Phys.* 89 (2001) 5243.

[32] Sangeeta, K. Chemakesavulu, D. G. Desai, S. C. Sabharwal, M. Alex, M. D. Ghodgaonkar, "Neutronflux measurments with an $Li_2B_4O_7$ crystal," *Nucl. Instrum. Meth. Phys. Res. A* 571 (2007) 699-703.

[33] Y. V. Burak, B. V. Padlyak, V. M. Shevel, "Radiation-induced centers in the $Li_2B_4O_7$ singlecrystals," *Nucl. Instrum. Methods Phys. Res. B* 191 (2002) 633-637.

[34] R. A. Lukaszew, Y. Sheng, C. Uher, and R. Clarke, "Use of magnetocrystalline anisotropy in spindependenttunneling", *Appl. Phys. Lett.* 75 (1999) 1942-1943.

[35] O. Tsuda, K. Watanabe, and T. Taniguchi, "Band-edge luminescence at room temperature of boron nitride synthesized by thermal chemical vapor phase deposition", *Jpn. J. Appl. Phys.* 46 (2007)L287-L290.

[36] D. Litvinov, R. Clarke, "Reduced bias growth of purephase cubic boron nitride", *Appl. Phys. Lett.* 71 (1997) 1969-1971.

[37] D. Litvinov, R. Clarke, "In situ texture monitoring for growth of oriented cubic boron nitridefilms", *Appl. Phys. Lett.* 74 (1999) 955-957.

[38] S. Berner, M. Corso, R. Widmer, O. Groening, R. Laskowski, P. Blaha, K. Schwarz, A. Goriachko, H. Over, S. Gsell, M. Schreck, H. Sachdev, T. Greber, J. Osterwalder, *Angew. Chem. Int. Ed.* 46, (2007) 5115.

While the present invention has been disclosed both generically, and with reference to specific alternatives, those alternatives are not intended to be limiting unless reflected in the claims set forth below. The invention is limited only by the provisions of the claims, and their equivalents, as would be recognized by one of skill in the art to which this application is directed.

What is claimed is:

1. A solid state neutron detector comprising a layer of a p-type semiconductor, an insulator and an n-type semiconductor, wherein at least one of said p or n-type layers comprises Gd in an amount of 3-30 atomic percent.

2. The solid state neutron detector of claim 1, wherein said layer comprising Gd is a p-type layer.

3. The solid state neutron detector of claim 1, wherein said layer comprising Gd is an n-type layer.

4. The solid state neutron detector of claim 1, wherein said insulator is comprised of $SiO_2$.

5. The solid state neutron detector of claim 1, wherein said insulator comprises Gd in amounts of 3-30%.

6. A solid state neutron detector comprised of a layer of a Gd-doped semiconductor on one side of an insulator and a single crystal semiconducting layer of $Li_2B_4O_7$ on an opposing side of said insulator.

7. The solid state neutron detector of claim 6, wherein said insulator comprises Gd.

* * * * *